(12) United States Patent
Nakaoka et al.

(10) Patent No.: US 8,355,270 B2
(45) Date of Patent: Jan. 15, 2013

(54) SEMICONDUCTOR DEVICE HAVING OPEN BIT LINE ARCHITECTURE

(75) Inventors: Yuji Nakaoka, Tokyo (JP); Hiroshi Ichikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 173 days.

(21) Appl. No.: 12/910,204

(22) Filed: Oct. 22, 2010

(65) Prior Publication Data

US 2011/0096584 A1    Apr. 28, 2011

(30) Foreign Application Priority Data

Oct. 26, 2009   (JP) ................................. 2009-245619

(51) Int. Cl.
*G11C 5/06* (2006.01)
(52) U.S. Cl. ..................... 365/63; 365/230.01; 365/231; 365/207; 365/189.05; 365/230.06

(58) Field of Classification Search .................... 365/63, 365/230.01, 196, 207, 189.05, 230.06, 231
See application file for complete search history.

(56) References Cited

U.S. PATENT DOCUMENTS 6,370,054 B1    4/2002  Fujisawa et al.

FOREIGN PATENT DOCUMENTS

| JP | 11-213697 A | 8/1999 |
|---|---|---|
| JP | 2001-135075 A | 5/2001 |

*Primary Examiner* — Thong Q Le
(74) *Attorney, Agent, or Firm* — Foley & Lardner LLP

(57) ABSTRACT

When an I/O number is 8 bit, a semiconductor device includes a first memory mat that is selected when X13 is (0) and X11 and X12 are (0, 0), a second memory mat that is selected when X13 is (1) and X11 and X12 are (0, 0), and a third memory mat that is selected irrespective of a value of X13 when X11 and X12 are (0, 0). When the I/O number is 16 bit, X13 is ignored, and the first to third memory mats are selected when X11 and X12 are (0, 0). In this manner, because the third memory mat is shared between so-called upper side and lower side, control is prevented from becoming complicated and an area is prevented from increasing.

20 Claims, 11 Drawing Sheets

FIG.6A

| X11~13 ADDRESS | 0,0,0 | 1,0,0 | 0,1,0 | 1,1,0 | 1,0,1 | 0,1,1 | 1,1,1 | 0,0,1 |
|---|---|---|---|---|---|---|---|---|
| MEMORY MAT | 0, 4 | 1 | 2 | 3 | 5 | 6 | 7 | 4, 8 |
| SENSE AMPLIFIER | A, D, E | A, B | B, C | C, D | E, F | F, G | G, H | D, E, H |
| LIO | A, D | A, B | B, C | C, D | E, F | F, G | G, H | E, H |
| MIO | U0~7 | U0~7 | U0~7 | U0~7 | L0~7 | L0~7 | L0~7 | L0~7 |
| RWAMP | U0~7 | U0~7 | U0~7 | U0~7 | L0~7 | L0~7 | L0~7 | L0~7 |

FIG.6B

| X11~12 ADDRESS | 0,0 | 1,0 | 0,1 | 1,1 |
|---|---|---|---|---|
| MEMORY MAT | 0, 4, 8 | 1, 5 | 2, 6 | 3, 7 |
| SENSE AMPLIFIER | A, D, E, H | A, B, E, F | B, C, F, G | C, D, G, H |
| LIO | A, D, E, H | A, B, E, F | B, C, F, G | C, D, G, H |
| MIO | U0~7 L0~7 | U0~7 L0~7 | U0~7 L0~7 | U0~7 L0~7 |
| RWAMP | U0~7 L0~7 | U0~7 L0~7 | U0~7 L0~7 | U0~7 L0~7 |

FIG.9A

| X11~13 ADDRESS | 0,0,0 | 1,0,0 | 0,1,0 | 1,1,0 | 0,0,1 | 1,0,1 | 0,1,1 | 1,1,1 |
|---|---|---|---|---|---|---|---|---|
| MEMORY MAT | 0, 8 | 1 | 2 | 3 | 4 | 5 | 6 | 7 |
| SENSE AMPLIFIER | A, H | A, B | B, C | C, D | D, E | E, F | F, G | G, H |
| LIO | A, H | A, B | B, C | C, D | D, E | E, F | F, G | G, H |
| MIO | U0,2,4,6 L1,3,5,7 | U0~7 | U0~7 | U0~7 | U1,3,5,7 L0,2,4,6 | L0~7 | L0~7 | L0~7 |
| RWAMP | U0,2,4,6 L1,3,5,7 | U0~7 | U0~7 | U0~7 | U1,3,5,7 L0,2,4,6 | L0~7 | L0~7 | L0~7 |

FIG.9B

| X11~12 ADDRESS | 0,0 | 1,0 | 0,1 | 1,1 |
|---|---|---|---|---|
| MEMORY MAT | 0, 4, 8 | 1, 5 | 2, 6 | 3, 7 |
| SENSE AMPLIFIER | A, D, E, H | A, B, E, F | B, C, F, G | C, D, G, H |
| LIO | A, D, E, H | A, B, E, F | B, C, F, G | C, D, G, H |
| MIO | U0~7 L0~7 | U0~7 L0~7 | U0~7 L0~7 | U0~7 L0~7 |
| RWAMP | U0~7 L0~7 | U0~7 L0~7 | U0~7 L0~7 | U0~7 L0~7 |

SEMICONDUCTOR DEVICE HAVING OPEN BIT LINE ARCHITECTURE

BACKGROUND OF THE INVENTION

1. Field of the Invention

The present invention relates to a semiconductor device, and more particularly relates to a semiconductor device including a memory cell array of an open bit line architecture.

2. Description of Related Art

In a DRAM (Dynamic Random Access Memory), which is a representative type of semiconductor memory devices, there has been known an open bit line architecture and a folded bit line architecture as methods for connecting a pair of bit lines to a sense amplifier. The open bit line architecture is a method in which a pair of bit lines connected to one sense amplifier is wired in mutually opposite directions with the sense amplifier sandwiched therebetween. Therefore, the pair of bit lines connected to the one sense amplifier is respectively allocated to a different memory mat. On the other hand, the folded bit line architecture is a method in which a pair of bit lines connected to one sense amplifier is wired in the same direction from the sense amplifier. Therefore, the pair of bit lines connected to the one sense amplifier is allocated to a same memory mat.

The DRAM of the open bit line architecture has a characteristic such that a memory capacity of memory mats located at end portions in a bit line direction can be half of a memory capacity of other memory mats. Therefore, there is widely used a technique where address allocation is performed such that two memory mats located at the end portions are always selected simultaneously, thereby securing the same memory capacity as that when the other memory mats are selected (see Japanese Patent Application Laid-open No. 2001-135075).

Meanwhile, semiconductor memory devices such as DRAMs are occasionally designed such that an I/O number (a bit number of data that can be simultaneously input/output with respect to outside) is selectable (see Japanese Patent Application Laid-open No. H11-213697). When the open bit line architecture is employed in such DRAMs, there occur problems that selection of I/O lines becomes complicated, an area of the memory cell array increases and the like. These problems are explained below with reference to FIGS. 7 to 11. The following explanations with reference to FIGS. 7 to 11 do not represent a known prior art, but they present hypothetical examples assumed by the present inventor(s) to explain the problems mentioned above.

FIG. 7 is a first example of a DRAM of the open bit line architecture in which the I/O number can be set to 8 bits or 16 bits. The DRAM shown in FIG. 7 is a DDR2 (Double Data Rate 2) DRAM in which a prefetch number is 4 bits. Therefore, when the I/O number is set to 8 bits, data of 32 (=8×4) bits is simultaneously input/output from a memory cell array, and when the I/O number is set to 16 bits, data of 64 (=16×4) bits is simultaneously input/output from the memory cell array.

In the example shown in FIG. 7, nine memory mats MAT0 to MAT8 are arranged next to each other in that order in a Y direction, and sense amplifier arrays SA(A) to SA(H) are arranged between the memory mats that are adjacent to each other in the Y direction. Each sense amplifier array is of the open bit line architecture, and one sense amplifier array is allocated with respect to two memory mats that are adjacent to each other in the Y direction. Each sense amplifier array is connected to four pairs of main I/O wirings MIO via four pairs of local I/O wirings LIO. As a result, data of 4 bits is output/input from/in each sense amplifier array. In FIG. 7, four pairs of the local I/O wirings LIO and four pairs of the main I/O wirings MIO are shown with one solid line, respectively. With this configuration, the nine memory mats MAT0 to MAT8 arranged next to each other in the Y direction can input/output data of 16 bits simultaneously at the maximum. As shown in FIG. 7, because four columns of memory mats are arranged along an X direction, data of 64 bits in total can be input/output simultaneously.

Selection of memory mats is performed by using upper bits X11 to X13 of a row address. A 3-bit value (*, *, *) assigned to a memory mat in FIG. 7 represents the upper bits X11 to X13 of a corresponding row address. As shown in FIG. 7, the same row address with the upper bits X11 to X13=(0, 0, 0) is assigned to the memory mats MAT0 and MAT8 located at both the end portions in the Y direction; therefore, these memory mats MAT0 and MAT8 are always accessed simultaneously. A memory capacity of the memory mats MAT0 and MAT8 is half of a memory capacity of the other memory mats MAT1 to MAT7. Remaining bits X10 to X0 of the row address are supplied to a row decoder XDEC and these bits are used for selecting word lines in the selected memory mat. A column address is supplied to a column decoder YDEC and it is used for selecting a column switch that connects a sense amplifier to a local I/O wiring.

When the I/O number is set to 8 bits, one memory mat among the memory mats MAT1 to MAT7, or both the memory mats MAT0 and MAT8 are selected. As a result, data of 32 bits are simultaneously input/output by using 32 pairs of the main I/O wirings MIO. The remaining 32 pairs of the main I/O wirings MIO are not used. On the other hand, when the I/O number is set to 16 bits, twice the number of memory mats in the above case are selected by ignoring (don't care) the uppermost bit X13 of the row address. As a result, data of 64 bits are simultaneously input/output by using 64 pairs of the main I/O wirings MIO.

Assuming that a memory mat MATU (an upper side) is selected when a logical level of the uppermost bit X13 is 0, and a memory mat MATL (a lower side) is selected when the logical level of the uppermost bit X13 is 1, then it can be seen from FIG. 7 that, the sense amplifier arrays SA(D) and SA(H) are sandwiched between the memory mat MATU and the memory mat MATL. No problem arises when the uppermost bit X13 is ignored, that is, when the I/O number is set to 16 bits. However, when the uppermost bit X13 is valid, that is, when the I/O number is set to 8 bits, a connection relation between the memory mat MATU and the memory mat MATL and read/write buses changes depending on which one of the memory mat MATU and the memory mat MATL is accessed.

As a result, as shown in FIG. 8, which is an enlarged diagram, although the main I/O wiring MIO(U0) is fixedly allocated to the memory mat MATU and the main I/O wiring MIO(L0) is fixedly allocated to the memory mat MATL, because the main I/O wirings MIO(U1) and MIO(L1) are allocated to both the memory mats MATU and MATL, there arises a necessity for dynamic selection of a read/write amplifier RWAMP to be booted and switching of a connection relation between the read/write amplifier RWAMP and a read/write bus RWBS.

FIGS. 9A and 9B are tables showing a relation among the upper bits X11 to X13 of the row address and the selected memory mat and the like, where FIG. 9A represents a case where the I/O number is set to 8 bits and FIG. 9B represents a case where the I/O number is set to 16 bits.

It can be seen from FIG. 9B that, when the I/O number is set to 16 bits, control is simple because the uppermost bit X13 is ignored. In contrast, control is complicated in the case of FIG. 9A; because, when the I/O number is set to 8 bits, when the upper bits X11 to X13 of the row address are (0, 0, 0) or (0, 0, 1), the main I/O wiring MIO and the read/write amplifier RWAMP on both the upper side and the lower side are used.

FIG. 10 is a second example of a DRAM of the open bit line architecture in which it is possible to set the I/O number between 8 bit and 16 bit. The DRAM shown in FIG. 10 is also a DDR2 DRAM.

The DRAM shown in FIG. 10 differs from the DRAM shown in FIG. 7 in that, 10 pieces of the memory mats MAT0 to MAT9 are arranged in that order in the Y direction, the sense amplifier arrays SA(A) to SA(D) are arranged in between the memory mats MAT0 to MAT4 that are adjacent to each other in the Y direction, and the sense amplifier arrays SA(E) to SA(H) are arranged in between the memory mats MAT5 to MAT9 that are adjacent to each other in the Y direction. Because no memory mat is arranged between the memory mats MAT4 and MAT5, these memory mats MAT4 and MAT5 have, similarly to the memory mats MAT0 and MAT9, a memory capacity that is half of the memory capacity of the other memory mats MAT1 to MAT3 and MAT6 to MAT8. Moreover, the same row addresses X11 to X13=(0, 0, 0) are assigned to the memory mats MAT0 and MAT4; therefore, these memory mats MAT0 and MAT4 are always accessed simultaneously. Similarly, the same row addresses X11 to X13=(0, 0, 1) are assigned to the memory mats MAT5 and MAT9; therefore, these memory mats MAT5 and MAT9 are always accessed simultaneously.

In the present example, because no sense amplifier array exists sandwiched between the memory mat MATU and the memory mat MATL, as shown in FIG. 11, which is an enlarged diagram, the main I/O wirings MIO(U0) and MIO(U1) are fixedly allocated to the memory mat MATU, and the main I/O wirings MIO(L0) and MIO(L1) are fixedly allocated to the memory mat MATL.

In this configuration, because it is not necessary to switch the connection relation between the read/write amplifier RWAMP and the read/write bus RWBS, the circuit configuration and the control become simple.

In the DRAM shown in FIG. 10; however, because four memory mats that have half the memory capacity of the other memory mats are used, an overall size of the memory array increases.

As explained above, when the open bit line architecture is employed in a DRAM in which it is possible to switch I/O numbers, there are problems such that selection of I/O lines becomes complicated, or the area of the memory cell array increases. These problems are not limited to DRAMs, but can occur to other semiconductor memory devices that employ the open bit line architecture, and can also occur to all semiconductor devices that include these devices.

SUMMARY

In one embodiment, there is provided a semiconductor device that includes a plurality of memory mats including at least first to third memory mats that can be selected based on first and second addresses. The first memory mat is selected when the first address has a first logical level and the second address has a predetermined value. The second memory mat is selected when the first address has a second logical level different from the first logical level and the second address has the predetermined value. The third memory mat is selected irrespective of a logical level of the first address when the second address has the predetermined value. In the present invention, the "memory mat" means a memory cell area that is sandwiched between sense amplifier arrays, or a memory cell area that is located at end portions, and represents a unit by which a same sense amplifier array is shared.

According to the present invention, because a third memory mat is shared between so-called upper side and lower side, neither control becomes complicated as in the semiconductor device shown in FIG. 7, nor the area of the memory cell array is increased as in the semiconductor device shown in FIG. 10.

BRIEF DESCRIPTION OF THE DRAWINGS

The above features and advantages of the present invention will be more apparent from the following description f certain preferred embodiments taken in conjunction with the accompanying drawings, in which:

FIGS. 6A and 6B are tables showing a relation among the upper bits X11 to X13 of the row address and the selected memory mat and the like, where FIG. 6A represents a case where the I/O number is set to 8 bits, and FIG. 6B represents a case where the I/O number is set to 16 bits;

FIGS. 9A and 9B are tables showing a relation among the upper bits X11 to X13 of the row address and the selected memory mat and the like, where FIG. 9A represents a case where the I/O number is set to 8 bits and FIG. 9B represents a case where the I/O number is set to 16 bits;

DETAILED DESCRIPTION OF THE EMBODIMENTS

Preferred embodiments of the present invention will be explained below in detail with reference to the accompanying drawings.

Figure 1:
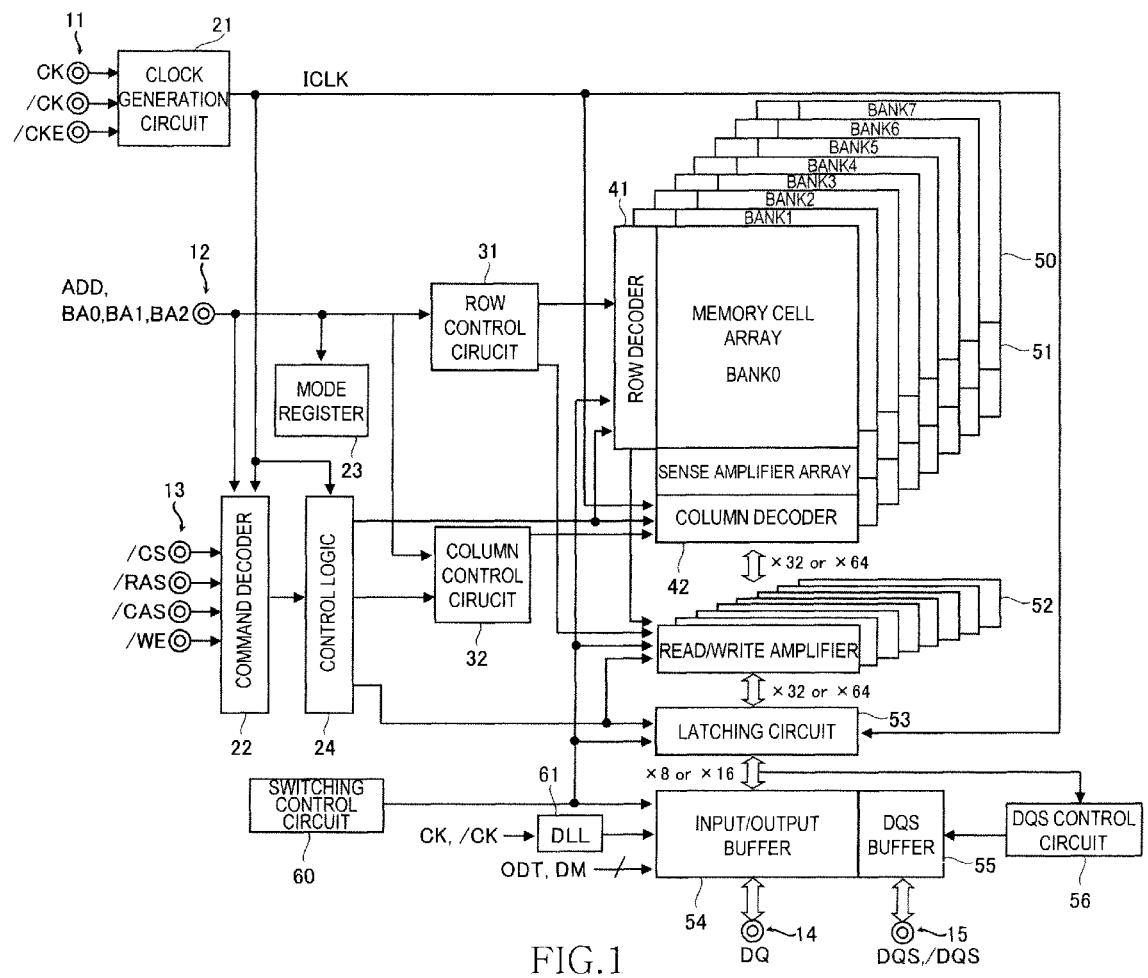
FIG. 1 is a block diagram showing a configuration of a semiconductor device according to an embodiment of the present invention.

FIG. 1 is a block diagram showing a configuration of a semiconductor device according to an embodiment of the present invention.

The semiconductor device according to the present embodiment is a DDR2 synchronous DRAM (Synchronous Dynamic Random Access Memory) in which it is possible to set an I/O number to 8 bits or 16 bits. Because a prefetch number of the DDR2 synchronous DRAM is 4, when the I/O number is set to 8 bits, data of 32 bits is simultaneously input/output, and when the I/O number is set to 16 bits, data of 64 bits is simultaneously input/output.

The semiconductor device according to the present embodiment includes at least clock terminals 11, an address terminal 12, command terminals 13, a data input output terminal 14, and a data strobe terminal 15 as external terminals.

The clock terminals 11 are terminals to which clock signals CK and /CK, and a clock enable signal /CKE are supplied. The clock signals CK and /CK, and the clock enable signal /CKE are then supplied to a clock generation circuit 21. In the present specification, when a signal name begins with a slash (/), it means that the signal is a reverse signal or a low active signal of the corresponding signal. That is, the clock signals CK and /CK are mutually complementary signals. The clock generation circuit 21 generates an internal clock signal ICLK. The generated internal clock signal ICLK is then supplied to various circuit blocks.

The address terminal 12 is a terminal to which an address signal ADD and bank addresses BA0 to BA2 are supplied. The address signal ADD and the bank addresses BA0 to BA2 are then supplied to a row control circuit 31 and a column control circuit 32. The row control circuit 31 controls a row decoder 41 based on a row address contained in the address signal ADD and the bank addresses BA0 to BA2. On the other hand, the column control circuit 32 controls a column decoder 42 based on a column address contained in the address signal ADD and the bank addresses BA0 to BA2. The row decoder 41 selects a word line WL included in a memory cell array 50 based on the row address. On the other hand, the column decoder 42 controls a connection between a sense amplifier included in a sense amplifier array 51 and a read/write amplifier 52 based on the column address.

In the present embodiment, the memory cell array 50 is divided into eight banks BANK0 to BANK7, and selection of the banks is performed by using the bank addresses BA0 to BA2. A bank is a unit circuit that can receive a command independently. As explained at a later stage, the memory cell array 50 and the sense amplifier array 51 have an open bit line architecture.

As shown in FIG. 1, the address signal ADD and the bank addresses BA0 to BA2 are also supplied to a command decoder 22 and a mode register 23. The command decoder 22 receives a row address signal /RAS, a column address signal /CAS, a write enable signal /WE, and a chip select signal /CS via the command terminals 13, and decodes these signals. The command decoder 22 supplies the decoded signals to a control logic 24. The control logic 24 controls various circuit blocks, such as the column control circuit 32 and a latching circuit 53, based on the decoded signals.

The latching circuit 53 performs parallel-to-serial conversion (serial-to-parallel conversion) on signals that are exchanged between the read/write amplifier 52 and an input/output buffer 54. The latching circuit 53 and the read/write amplifier 52 are connected to each other with 64 pieces of read/write buses RWBS. Transfer of data between the latching circuit 53 and the read/write amplifier 52 is performed by using 32 pieces of the read/write buses RWBS when the I/O number is set to 8 bits, and by using 64 pieces of the read/write buses RWBS when the I/O number is set to 16 bits. A width of data exchanged between the latching circuit 53 and the input/output buffer 54 is equal to the I/O number. That is, the width of data is 8 bits when the I/O number is set to 8 bits, and 16 bits when the I/O number is set to 16 bits.

Selection of the I/O number is performed by a switching control circuit 60. Although not limited thereto, the switching control circuit 60 selects the I/O number at the last stage of a manufacturing process by using a bonding option and the like. An output of the switching control circuit 60 is supplied not only to the input/output buffer 54, but also to the row decoder 41, the read/write amplifier 52, and the latching circuit 53. These circuits perform switching of their operation modes appropriate to the I/O number specified in the output of the switching control circuit 60. Because the number of bits of a row address to be used varies depending on the I/O number, an output of the row control circuit 31 (or the row decoder 41) is also supplied to the read/write amplifier 52.

The input/output buffer 54 outputs read data and receives write data via the data/input output terminal 14. An operation timing of the input/output buffer 54 is controlled by a DLL circuit 61. The DLL circuit 61 also controls an input/output timing of data strobe signals DQS and /DQS output from and input into a DQS buffer 55. An operation of the DQS buffer 55 is controlled by a DQS control circuit 56.

A termination control signal ODT and a data mask signal DM are also supplied to the input/output buffer 54. The termination control signal ODT is a signal for causing the input/output buffer 54 to function as a termination resistance. The data mask signal DM is a signal for masking a part of the read data or the write data.

The overall configuration of the semiconductor device according to the present embodiment is as described above. A configuration of the semiconductor device according to the present embodiment is explained in more detail below while focusing on a configuration of the memory cell array 50.

Figure 2:
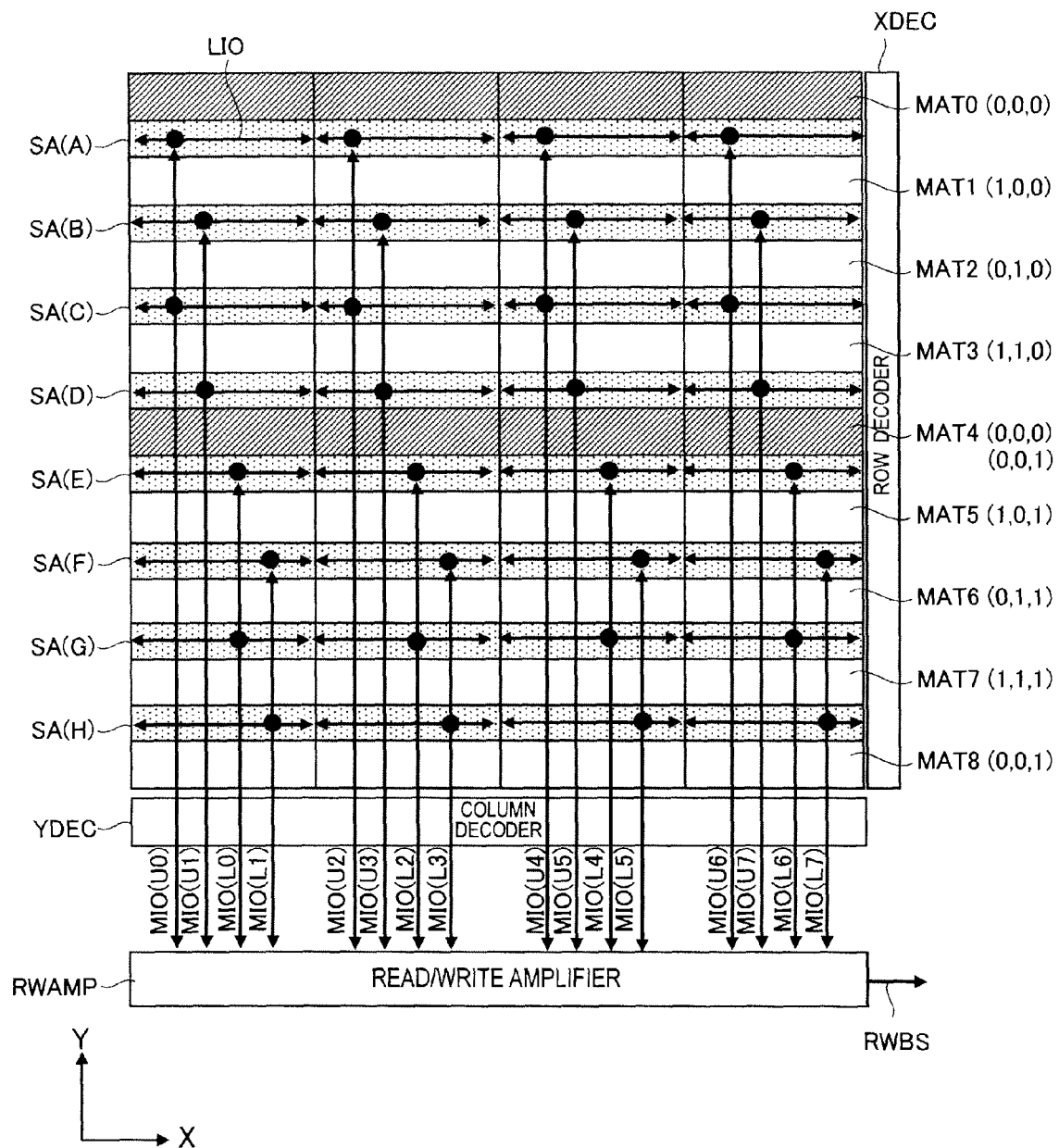
FIG. 2 is a partially enlarged schematic diagram of the memory cell array, which shows a memory mat accessed in case of (X11, X12, X13)=(0, 0, 0)

FIG. 2 is a partially enlarged schematic diagram of the memory cell array 50.

As shown in FIG. 2, in the present embodiment, nine memory mats MAT0 to MAT8 are arranged in that order in a Y direction, and sense amplifier arrays SA(A) to SA(H) are arranged between the memory mats that are adjacent to each other in the Y direction. The sense amplifier arrays SA(A) to SA(H) are a of the sense amplifier array 51 shown in FIG. 1.

Each sense amplifier array is of the open bit line architecture, and one sense amplifier array is allocated with respect to two memory mats that are adjacent to each other in the Y direction. Each sense amplifier array is connected to four pairs of main I/O wirings MIO via four pairs of local I/O wirings LIO. As a result, data of 4 bits is output from or data of 4 bits is input in each sense amplifier array. In FIG. 2, four pairs of the local I/O wirings LIO and four pairs of the main I/O wirings MIO are shown with one solid line, respectively. With this configuration, the nine memory mats MAT0 to MAT8 arranged next to each other in the Y direction can input/output data of 16 bits simultaneously at the maximum. As shown in FIG. 2, because four columns of memory mats are arranged along an X direction, data of 64 bits in total can be input/output simultaneously.

Selection of a memory mat is performed by using upper bits X11 to X13 of a row address. A 3-bit value (*, *, *) assigned to the memory mats in FIG. 2 represents the upper bits X11 to X13 of a corresponding row address. As shown in FIG. 2, because different row addresses are assigned to the memory mats MAT0 and MAT8 located at both end portions in the Y direction, these memory mats MAT0 and MAT8 are never accessed simultaneously when the I/O number is set to 8 bits. Although planar sizes of the memory mats MAT0 to MAT8 are mutually the same, memory capacities of the memory mats MAT0 and MAT8 are half of memory capacities of the other memory mats MAT1 to MAT7.

Figure 3:
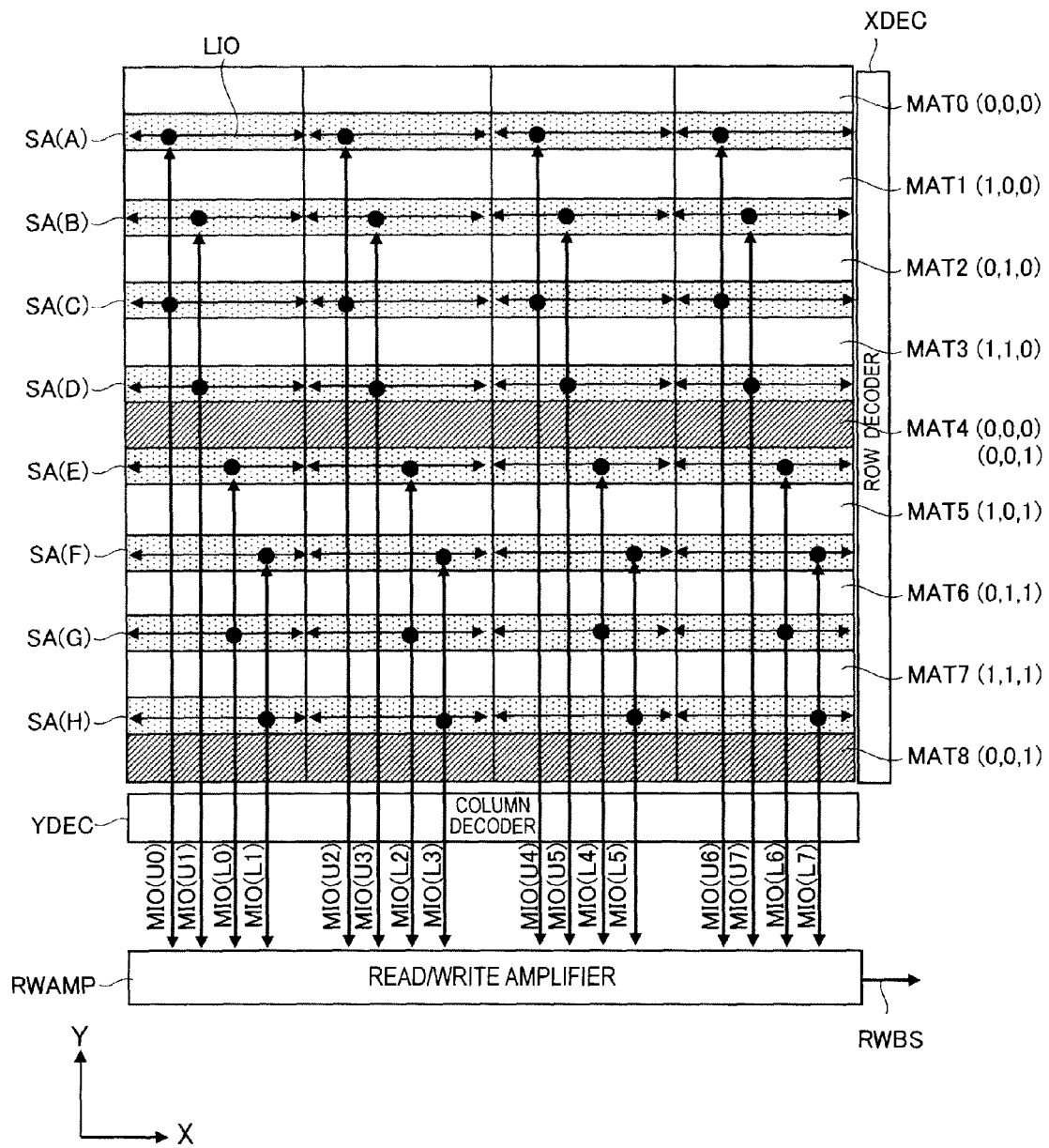
FIG. 3 is a partially enlarged schematic diagram of the memory cell array, which shows a memory mat accessed in case of (X11, X12, X13)=(0, 0, 1)

In the present embodiment, two upper bits X11 to X13 of the row address are assigned to the memory mat MAT4 that is located in a central portion in the Y direction. Specifically, the upper bits X11 to X13=(0, 0, 0) and the upper bits X11 to X13=(0, 0, 1) are assigned to the memory mat MAT4. The upper bits X11 to X13=(0, 0, 0) are also assigned to the memory mat MAT0 that is located at one end portion. Therefore, the same memory capacity as that of the other memory mats is secured by combining the memory capacity of the memory mat MAT0 (half of the normal memory capacity) and half of the memory capacity of the memory mat MAT4. The memory mats MAT0 and MAT4 shown with hatching in FIG. 2 are the memory mats that are accessed when the upper bits X11 to X13=(0, 0, 0). Similarly, the upper bits X11 to X13=(0, 0, 1) are assigned to the memory mat MAT8 that is located at the other end portion. Therefore, the same memory capacity as that of the other memory mats is secured by combining the memory capacity of the memory mat MAT8 (half of the normal memory capacity) and half of the memory capacity of the memory mat MAT4. The memory mats MAT4 and MAT8 shown with hatching in FIG. 3 are the memory mats that are accessed when the upper bits X11 to X13=(0, 0, 1).

Thus, when the upper bit X13 is taken as a first address and the upper bits X11 and X12 are taken as a second address, the memory mat MAT0 is accessed when a logical level of the first address is 0 while the second address is (0, 0), the memory mat MAT8 is accessed when the logical level of the first address is 1 while the second address is (0, 0), and the memory mat MAT4 is accessed irrespective of the logical level of the first address while the second address is (0, 0).

Remaining bits X10 to X0 of the row address are supplied to a row decoder XDEC and these bits are used for selecting word lines in the selected memory mat. A column address is supplied to a column decoder YDEC and it is used for selecting a column switch that connects a sense amplifier to a local I/O wiring. The row decoder XDEC shown in FIGS. 2 and 3 is a part of the row decoder 41 shown in FIG. 1. Similarly, the column decoder YDEC shown in FIGS. 2 and 3 is a part of the column decoder 42 shown in FIG. 1.

When the I/O number is set to 8 bits, one memory mat is selected from the memory mats MAT1 to MAT3 and MAT4 to MAT7, and both the memory mats MAT0 and MAT4 or both the memory mats MAT4 and MAT8 are selected. As a result, 32 bits of data are simultaneously input/output by using the 32 pairs of the main I/O wirings MIO. The remaining 32 pairs of the main I/O wirings MIO are not used. On the other hand, when the I/O number is set to 16 bits, twice the number of memory mats in the above case are selected by ignoring (don't care) the uppermost bit X13 of the row address. As a result, data of 64 bits are simultaneously input/output by using 64 pairs of the main I/O wirings MIO.

Figure 4:
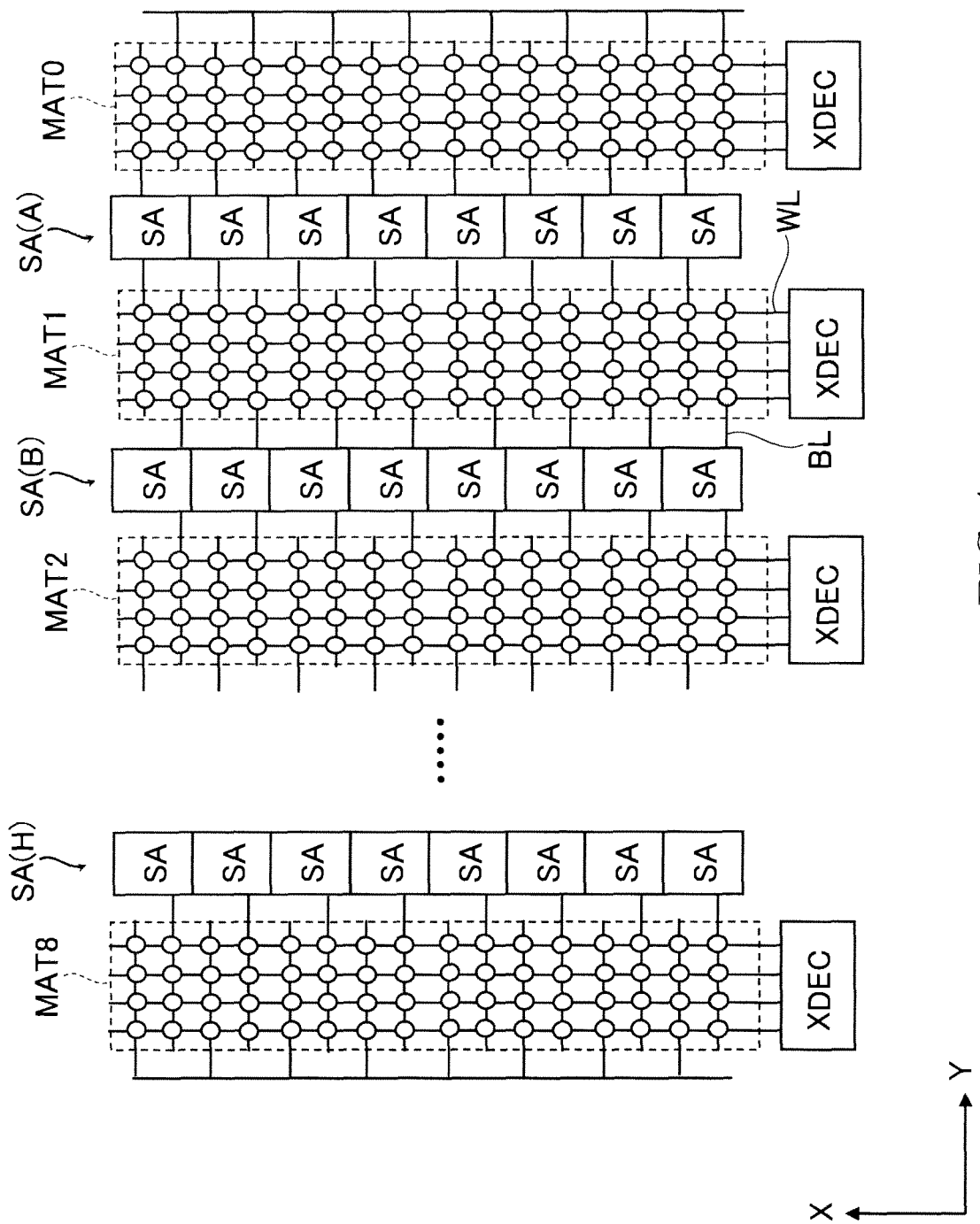
FIG. 4 shows a structure of the memory mat in detail.

FIG. 4 shows a structure of the memory mat MAT in detail.

As shown in FIG. 4, a plurality of word lines WL are aligned parallel to the X direction, and a plurality of bit lines BL is aligned parallel to the Y direction in the memory mat MAT. A memory cell is arranged at each node of the word lines WL and the bit lines BL. The bit lines BL are connected alternately to the sense amplifiers SA that are adjacent to each other in the Y direction. That is, a pair of bit lines BL sandwiches the sense amplifier SA, and each bit line BL in the pair of bit lines BL is wired in mutually opposite directions.

In this configuration, with regard to the memory mats MAT0 and MAT8 that are located at the end portions in the Y direction, a sense amplifier array is present only on one side. Therefore, the number of accessible memory cells in these memory mats is reduced to half than that of the other memory mats. The number of memory cells that are actually formed in these memory mats is the same as that of the other memory mats to match the process conditions. That is, half of the memory cells in these memory mats is normal memory cells that are accessible, while the remaining half of the memory cells is dummy memory cells that are non-accessible.

Figure 5:
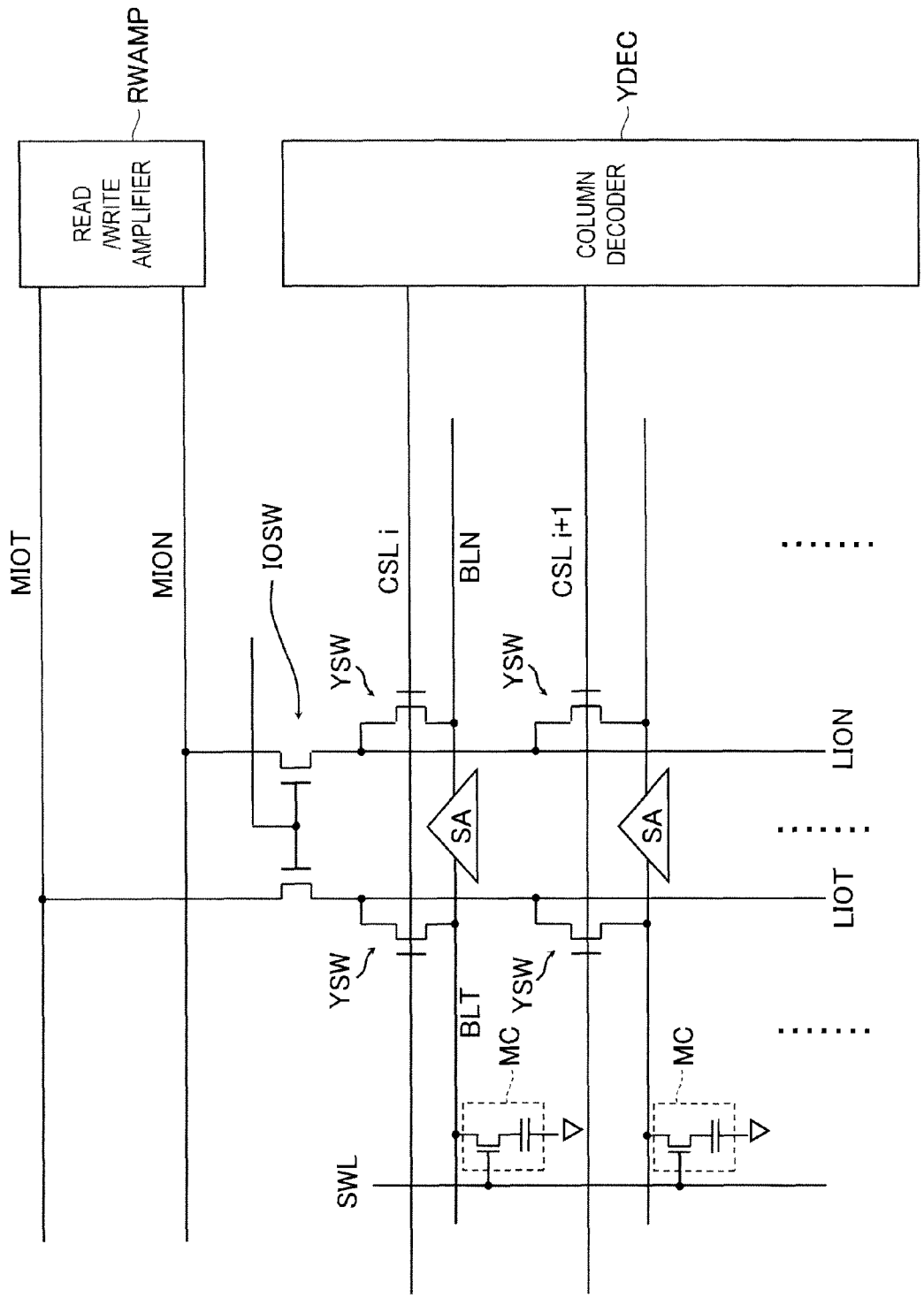
FIG. 5 is a circuit diagram showing in more detail a connection relation between the memory cell and the read/write amplifier.

FIG. 5 is a circuit diagram showing in more detail a connection relation between the memory cell MC and the read/write amplifier RWAMP. The read/write amplifier RWAMP shown in FIG. 5 is a part of the read/write amplifier 52 shown in FIG. 1.

As shown in FIG. 5, the memory cell MC is formed by a serial circuit constituted by a cell transistor and a cell capacitor. A gate electrode of the cell transistor is connected to a corresponding word line WL, and a source electrode and a drain electrode are connected to a corresponding bit line BLT (or BLN). A pair of the bit lines BLT and BLN is connected to a corresponding sense amplifier SA, and the pair the bit lines BLT and BLN is also connected to local I/O lines LIOT and LION via a column itch YSW. Selection of the column switch YSW is performed by using a column selection signal CSL output from the column decoder YDEC.

The local I/O lines LIOT and LION are connected to a pair of main I/O lines MIOT and MION via an I/O switch IOSW. The pair of main I/O lines MIOT and MION is connected to the read/write amplifier RWAMP.

Returning to FIG. 2, assuming that a memory mat MATU (an upper side) is selected when a logical level of the uppermost bit X13 is 0, and a memory mat MATL (a lower side) is selected when a logical level of the uppermost bit X13 is 1, then half of the memory mat MAT4 belongs to the upper side and the remaining half belongs to the lower side. Specifically, the memory cells of the memory mat MAT4 that belong to the upper side are connected to the sense amplifier array SA(D), and the memory cells of the memory mat MAT4 that belong to the lower side are connected to the sense amplifier array SA(E).

Therefore, when the I/O number is set to 8 bits, the sense amplifier arrays SA(A) and SA(D) are activated when the upper bits X11 to X13 of the row address=(0, 0, 0); however, it is necessary to activate the sense amplifier array SA(E) at the same time to prevent data damage on the lower side. Because the activation of the sense amplifier array SA(E) is simply a restoring operation for preventing the data damage, a corresponding column switch YSW or a corresponding I/O switch IOSW are kept in an off state. Similarly, the sense amplifier arrays SA(E) and SA(H) are activated when the upper bits X11 to X13 of the row address=(0, 0, 1); however, it is necessary to activate the sense amplifier array SA(D) at the same time to prevent data damage on the upper side. Because the activation of the sense amplifier array SA(D) is simply a restoring operation for preventing the data damage, a corresponding column switch YSW or a corresponding I/O switch IOSW are kept in an off state.

In contrast, when the I/O number is set to 16 bits, because the uppermost bit of the row address is ignored, four sense amplifier arrays SA(A), SA(D), SA(E), and SA(H) are activated when the upper bits X11 and X12 of the row address= (0, 0), and the column switches YSW or the I/O switches IOSW corresponding to these four sense amplifier arrays are also activated.

When the upper bits X11 to X13 of the row address have other values (for example, (1, 0, 0)), two sense amplifier arrays (SA(A) and SA(B)) located on either sides of the selected memory mat (MAT1) are activated. In this manner, in the present embodiment, three sense amplifiers are activated at the same time when the memory mats MAT0 and MAT8 located at the end portions are selected. An increase in a peak electric current due to this does not create any practical issue considering the fact that four sense amplifier arrays are activated at the same time when the I/O number is set to 16 bits.

Figure 11:
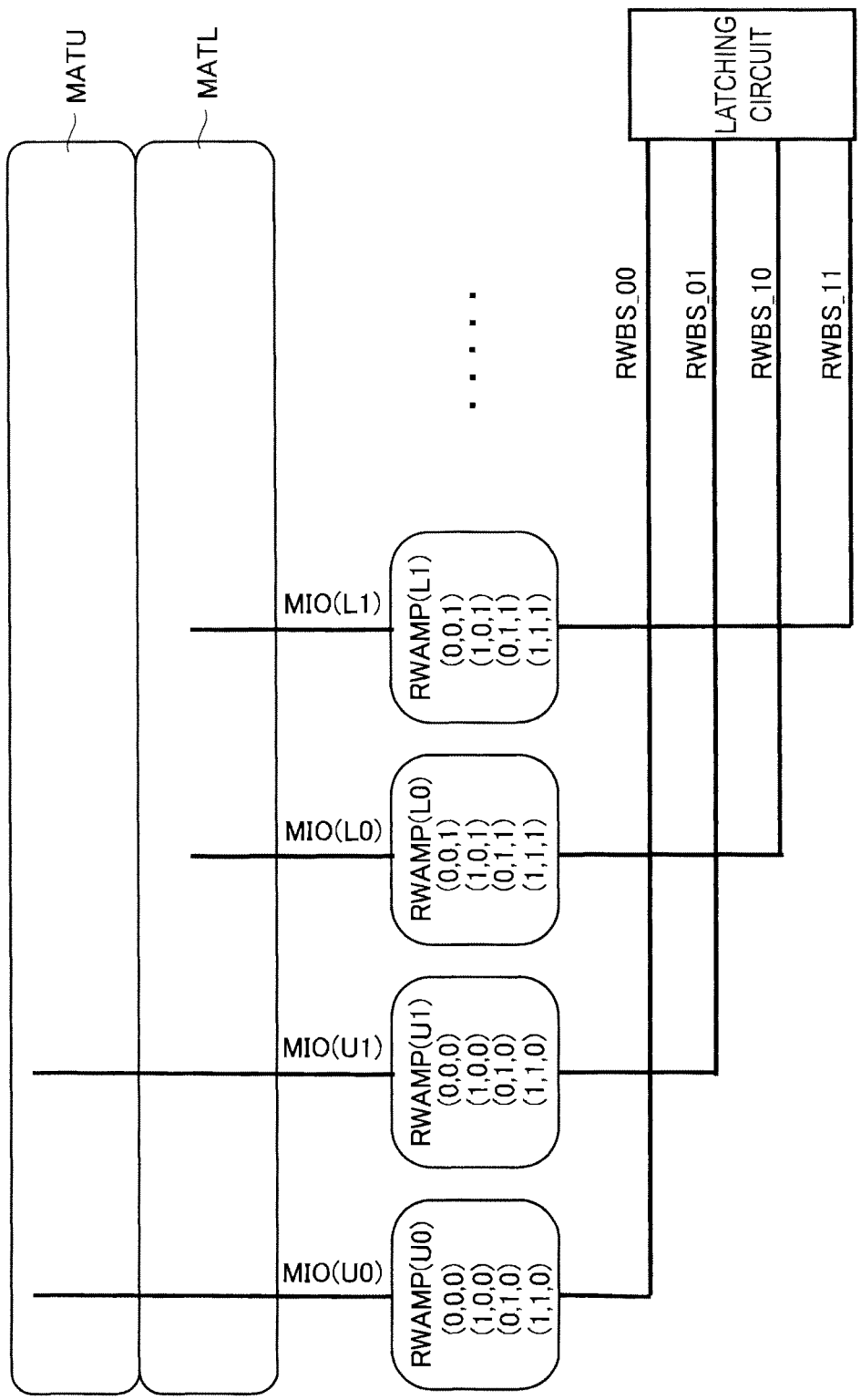
FIG. 11 is an enlarged diagram of the second example in FIG. 10.

In this manner, in the present embodiment, half of the memory mat MAT4 belongs to the memory mat MATU and the remaining half belongs to the memory mat MATL. Therefore, in the same manner as in the example shown in FIG. 11, the main I/O wirings MIO(U0) and MIO(U1) are fixedly allocated to the memory mat MATU, and the main I/O wirings MIO(L0) and MIO(L1) are fixedly allocated to the memory mat MATL. In this configuration, because it is not necessary to switch the connection relation between the read/write amplifier RWAMP and the read/write bus RWBS, the circuit configuration and the control becomes simple.

FIGS. 6A and 6B are tables showing a relation among the upper bits X11 to X13 of the row address and the selected memory mat and the like, where FIG. 6A represents a case where the I/O number is set to bits, and FIG. 6B represents a case where the I/O number is set to 16 bits.

It can be understood from FIGS. 6A and 6B that, irrespective of whether the I/O number is set to 8 bits or 16 bits, a correspondence relation between the memory mat and the read/write amplifier RWAMP is simple. As a result, as explained above, a circuit configuration can be made simple. In addition, different from the example shown in FIG. 10, because the memory mats with half the memory capacities are present only on both the end portions in the Y direction, the area of the memory cell array does not increase as compared to the area of the memory cell array of the example shown in FIG. 7.

Figure 7:
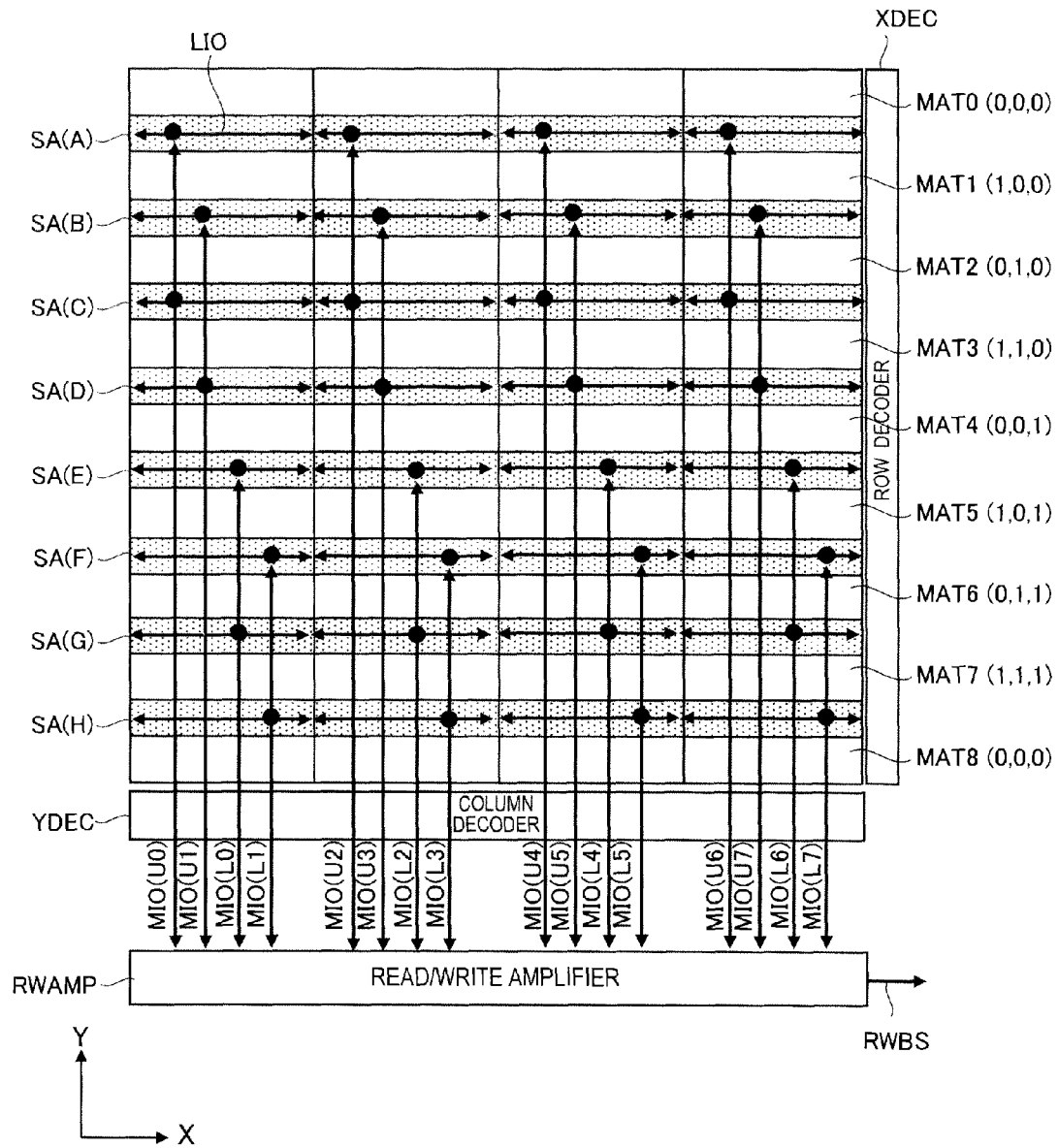
FIG. 7 is a first example of a DRAM of the open bit line architecture in which the I/O number can be set to 8 bits or 16 bits.
Figure 8:
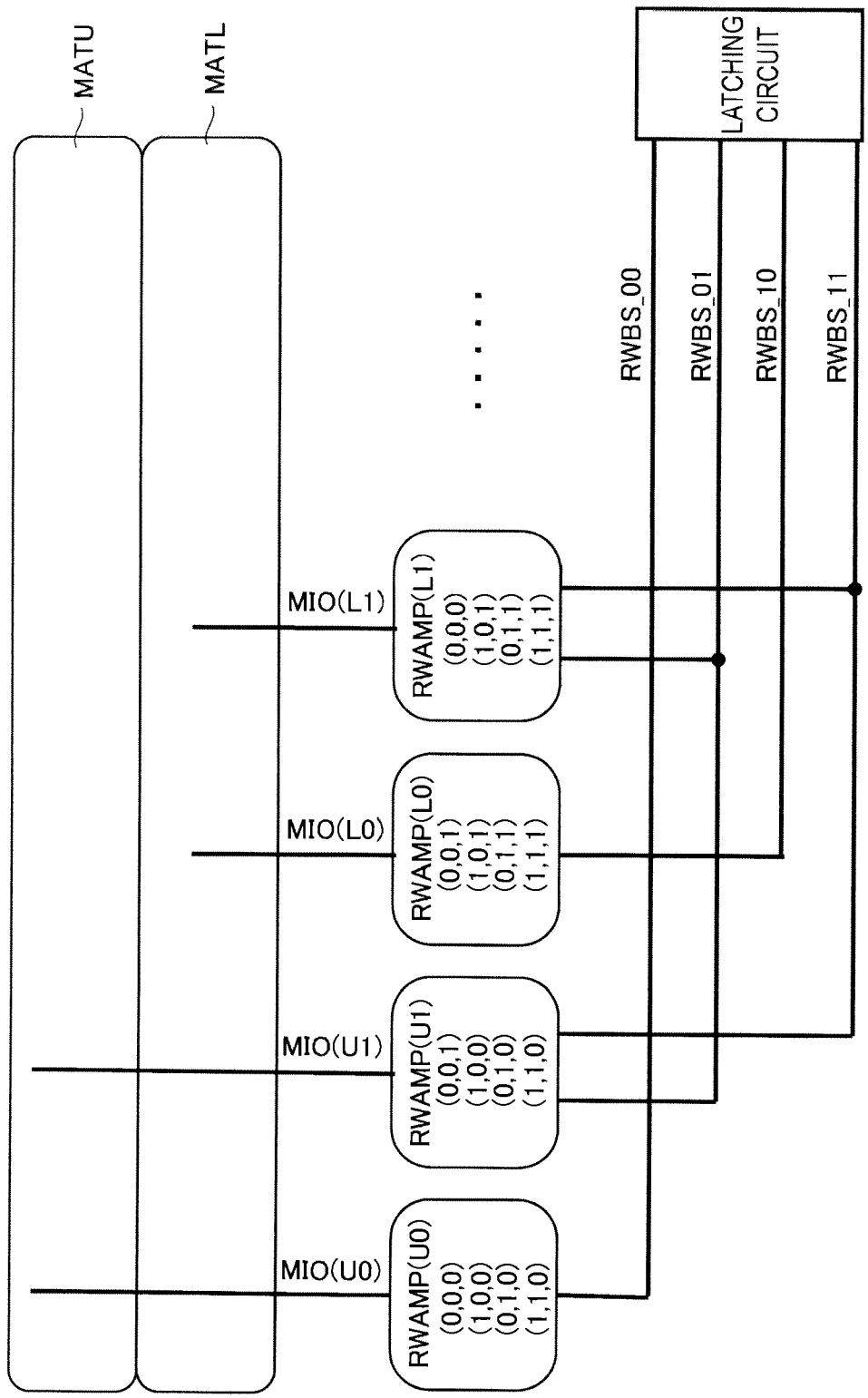
FIG. 8 is an enlarged diagram of the first example in FIG. 7.
Figure 10:
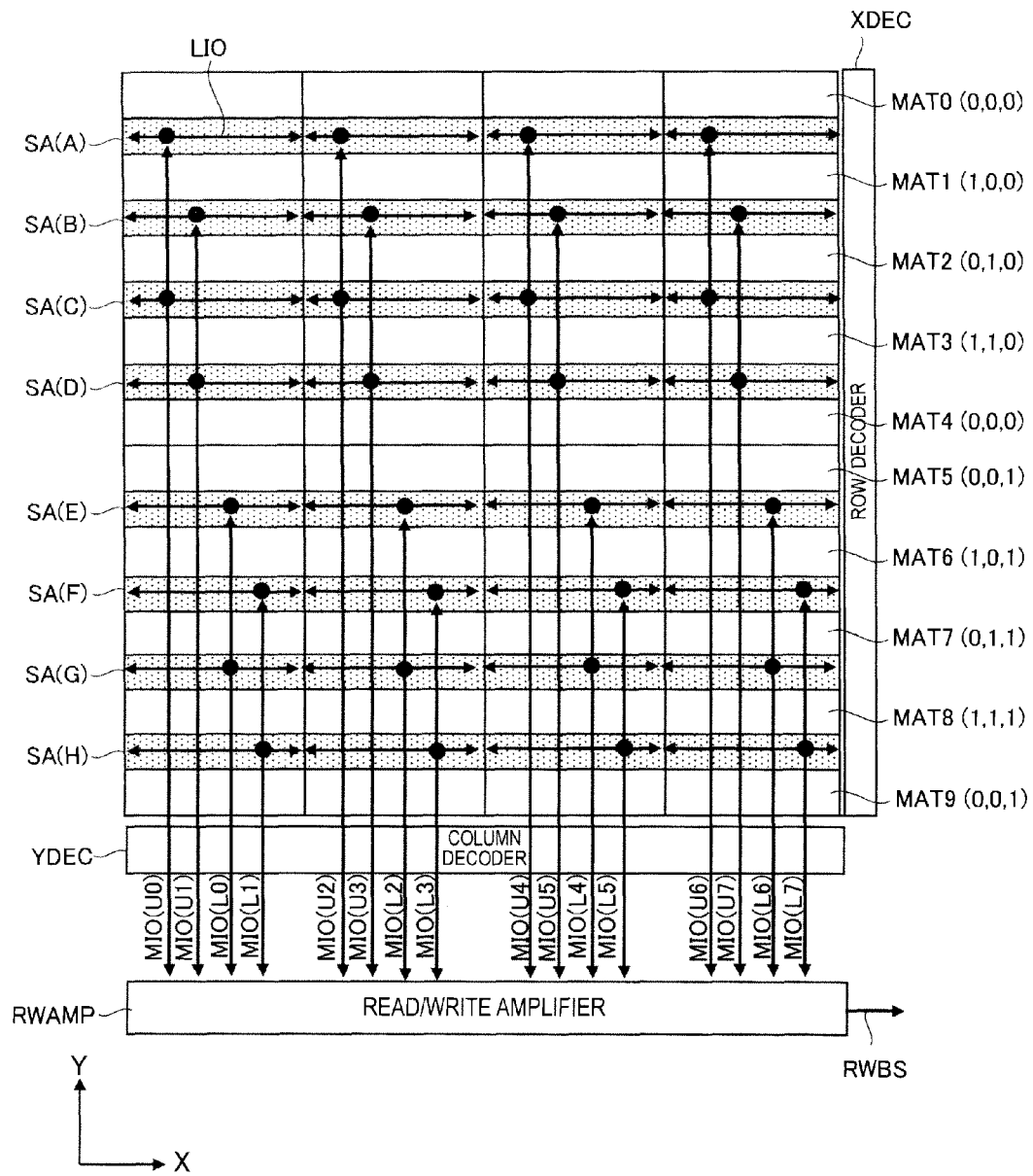
FIG. 10 is a second example of a DRAM of the open bit line architecture in which it is possible to set the I/O number between 8 bit and 16 bit.

As explained above, according to the present invention, because the memory mat MAT4 that is located at the central portion is shared between the upper side and the lower side, neither the control becomes complicated as in the semiconductor device shown in FIG. 7, nor the area of the memory cell array increases as in the semiconductor device shown in FIG. 10.

It is apparent that the present invention is not limited to the above embodiments, but may be modified and changed without departing from the scope and spirit of the invention.

The above embodiments have explained an example where the present invention is applied to a DRAM; however, the application target of the present invention is not limited to DRAMs. The present invention can be applied to other semiconductor memory devices, and can be also applied to other semiconductor devices that are not memory systems, as far as they include memory cell arrays.

What is claimed is:

1. A semiconductor device comprising:
a plurality of memory mats including at least first to third memory mats that can be selected based on an address signal includes first and second bits;
the first memory mat is selected when the first bit has a first logical level and the second bit has a predetermined value,
the second memory mat is selected when the first bit has a second logical level different from the first logical level and the second bit has the predetermined value, and
the third memory mat is selected irrespective of a logical level of the first bit when the second bit has the predetermined value.

2. The semiconductor device as claimed in claim 1, wherein number of accessible memory cells included in each of the first and second memory mats is less than number of memory cells included in the third memory mat.

3. The semiconductor device as claimed in claim 2, wherein the number of accessible memory cells included in each of the first and second memory mats is half of the number of memory cells included in the third memory mat.

4. The semiconductor device as claimed in claim 1, wherein the memory mats mutually have substantially a same planar size.

5. The semiconductor device as claimed in claim 1, wherein the semiconductor device has a first operation mode where the first bit is used and a second operation mode where the first bit is not used.

6. A semiconductor device comprising:
a plurality of memory mats including at least first to third memory mats that can be selected based on an address signal includes first and second bits;
the first memory mat is selected when the first bit has a first logical level and the second bit has a predetermined value,
the second memory mat is selected when the first bit has a second logical level different from the first logical level and the second bit has the predetermined value,
the third memory mat is selected irrespective of a logical level of the first bit when the second bit has the predetermined value;
a plurality of sense amplifier arrays including first to fourth sense amplifier arrays;
a plurality of I/O wirings including first to fourth I/O wirings; and
a plurality of switch circuits including first to fourth switch circuits that connect the first to fourth sense amplifier arrays to the first to fourth I/O wirings, respectively, wherein
the first sense amplifier array and the first switch circuit are activated when the first memory mat is selected,
the second sense amplifier array and the second switch circuit are activated when the second memory mat is selected, and
in case the third memory mat is selected, both of the third and fourth sense amplifier arrays and one of the third and fourth switch circuits are activated in the first operation mode, and one of the third and fourth sense amplifier arrays and one of the third and fourth switch circuits are activated in the second operation mode.

7. The semiconductor device as claimed in claim 6, wherein
data transmission using the first and third I/O wirings or the second and fourth I/O wiring is performed in the first operation mode, and
data transmission using the first to fourth I/O wirings is performed in the second operation mode.

8. The semiconductor device as claimed in claim 1, wherein the memory mats are arranged in line to one direction, the first memory mat is arranged at one end portion and the second memory mat is arranged at the other end portion.

9. The semiconductor device as claimed in claim 8, wherein the third memory mat is arranged at a central portion.

10. The semiconductor device as claimed in claim 8, wherein
a memory mat sandwiched between the first memory mat and the third memory mat is selected when the first bit has the first logical level and the second bit has a value different from the predetermined value, and
a memory mat sandwiched between the second memory mat and the third memory mat is selected when the first bit has the second logical level and the second bit has a value different from the predetermined value.

11. A semiconductor device comprising:
$0^{th}$ to $2^{(n+1)th}$ memory mats arranged in this order and that can be selected by a 1-bit first address and an n-bit second address; and
$1^{st}$ to $2^{(n+1)th}$ sense amplifier arrays, each of which is arranged between adjacent memory mats and connected to one or both of the adjacent memory mats, wherein the memory mats include a first group including $0^{th}$ to $2^{(n)th}$ memory mats and a second group including $2^{(n)th}$ to $2^{(n+1)th}$ memory mats, one of the first and second groups is selected based on the first address, and one of the memory mats included in the first and second groups is selected based on the second address, wherein number of accessible memory cells included in each of the $0^{th}$ memory mat and the $2^{(n+1)th}$ memory mat is half of number of memory cells included in other memory mats.

12. A device comprising:

a first memory mat including a plurality of first memory cells;

a second memory mat including a plurality of second memory cells that are substantially equal in number to the first memory cells;

a plurality of third memory mats each including a plurality of third memory cells that are substantially double in number of the first memory cells, the third memory mats being disposed between the first and second memory mats; and an access circuit configured to perform a first operation in which both of the first memory mat and a first one of the third memory mats are selected in response to first address information, both of the second memory mat and the first one of the third memory mats are selected in response to second address information, and a second one of the third memory mats is selected in response to third address information, the first, second and third address information being different from each other.

13. The device as claimed in claim 12, wherein the access circuit is further configured to perform a second operation in which the first memory mat, the second memory mat and the first one of the third memory mats are selected in response to fourth address information and the second one of the third memory mats and a third one of the third memory mats are selected in response to fifth address information, the fourth and fifth address information being different from each other, and the first and second operations being selectable so that the access circuit performs a selected one of the first and second operations.

14. The device as claimed in claim 12, wherein the third memory cells of the first one of the third memory mats being divided into first and second groups of memory cells, each of the first and second groups of memory cells being substantially equal in number to the first memory cells; and wherein the device further comprises:

a set of first sense amplifiers dedicated to the first memory cells;

a set of second sense amplifiers dedicated to the second memory cells;

a set of third sense amplifiers dedicated to the first group of memory cells; and a set of fourth sense amplifiers dedicated to the second group of memory cells;

each of the first, third and fourth sense amplifiers being activated in response to selection of the both of the first memory mat and the first one of the third memory mats, and each of the second, third and fourth sense amplifiers being activated in response to selection of the both of the second memory mat and the first one of the third memory mats.

15. The device as claimed in claim 14, further comprising first, second, third and fourth data lines, data stored on a selected one of the first memory cells and data stored in a selected one of the first group of memory cells being transferred respectively to the first and third data lines in response to the selection of the both of the first memory mat and the first one of the third memory mats, and data stored on a selected one of the second memory cells and data stored in a selected one of the second group of memory cells being transferred respectively to the second and fourth data lines in response to the selection of the both of the second memory mat and the first one of the third memory mats.

16. The device as claimed in claim 14, wherein the set of first sense amplifiers being disposed between the first memory mat and the first one of the third memory mats, the set of second amplifiers being disposed between the second memory mat and the first one of the third memory mats, the set of third sense amplifiers being disposed between the set of the first sense amplifiers and the first one of the third memory mats, and the set of fourth sense amplifiers being disposed between the set of the second sense amplifiers and the first one of the third memory mats.

17. The device as claimed in claim 12, wherein the first memory mat includes, in addition to the first memory cells, a plurality of first dummy memory cells that are substantially equal in number to the first memory cells, and the second memory mat includes, in addition to the second memory cells, a plurality of second dummy memory cells that are substantially equal in number to the second memory cells.

18. The device as claimed in claim 12, wherein the first operation includes a third one of the third memory mats being selected in response to fourth address information that is different from each of the first, second and third address information, the second one of the third memory mats being disposed between the first memory mat and the first one of the third memory mats, and the third one of the third memory mats being disposed between the second memory mat and the first one of the third memory mats.

19. The device as claimed in claim 18, further comprising at least four sets of sense amplifiers that are disposed to form a memory device of an open-bit-line architecture.

20. The device as claimed in claim 19, wherein a first one of the four sets of sense amplifiers is disposed between the first memory mat and the second one of the third memory mats, a second of the four sets of sense amplifiers being disposed between the first and second ones of the third memory mats, a third one of the four sets of sense amplifiers being disposed between the first and third ones of the third memory mats, and a fourth one of the four sets of sense amplifiers being disposed between the second memory mat and the third one of the third memory mats.

* * * * *